(12) United States Patent
Kokta et al.

(10) Patent No.: US 7,045,223 B2
(45) Date of Patent: *May 16, 2006

(54) SPINEL ARTICLES AND METHODS FOR FORMING SAME

(75) Inventors: Milan Kokta, Washougal, WA (US); Jennifer Stone-Sundberg, Portland, OR (US); Jeffrey Cooke, Camas, WA (US); Ronald Ackerman, Camas, WA (US); Hung Ong, Vancouver, WA (US); Emily Corrigan, Portland, OR (US)

(73) Assignee: Saint-Gobain Ceramics & Plastics, Inc., Worcester, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/669,141

(22) Filed: Sep. 23, 2003

(65) Prior Publication Data

US 2005/0064246 A1 Mar. 24, 2005

(51) Int. Cl.
*C30B 29/16* (2006.01)
*C30B 29/22* (2006.01)

(52) U.S. Cl. ............... 428/702; 428/64.1; 428/689; 428/697; 423/594.16; 423/600; 117/944; 117/950

(58) Field of Classification Search ........... 428/689, 428/697, 699, 701, 702; 423/600, 594.16; 117/944, 950
See application file for complete search history.

(56) References Cited

U.S. PATENT DOCUMENTS

| 3,424,955 | A |  | 1/1969 | Seiter et al. |
| 3,625,868 | A |  | 12/1971 | Grabmaier et al. |
| 3,655,439 | A |  | 4/1972 | Seiter |
| 3,658,586 | A |  | 4/1972 | Wang |
| 3,736,158 | A |  | 5/1973 | Cullen et al. |
| 3,753,775 | A |  | 8/1973 | Robinson et al. |
| 3,796,597 | A |  | 3/1974 | Porter et al. |
| 3,808,065 | A |  | 4/1974 | Robinson et al. |
| 3,816,906 | A |  | 6/1974 | Falckenberg |
| 3,883,313 | A |  | 5/1975 | Cullen et al. |
| 3,885,978 | A |  | 5/1975 | Doi et al. |
| 3,898,051 | A |  | 8/1975 | Schmid |
| 3,950,504 | A | * | 4/1976 | Belding et al. ............ 423/600 |
| 3,964,942 | A |  | 6/1976 | Berkenblit et al. |
| 3,990,902 | A | * | 11/1976 | Nishizawa et al. ......... 501/134 |
| 4,000,977 | A |  | 1/1977 | Falckenberg |
| 4,177,321 | A |  | 12/1979 | Nishizawa |

(Continued)

FOREIGN PATENT DOCUMENTS

CN 1291795 4/2001

(Continued)

OTHER PUBLICATIONS

Yumashev K.V., et al., "$Co^{2+}$-doped spinels saturable absorber Q-switches for 1.3-1.6 μm solid state lasers", OSA Trends in Optcs and Photonics. Advanced Solid State Lasers., vol. 34, pp. 236-239, 2000. XP008017966.

(Continued)

*Primary Examiner*—Stephen Stein
(74) *Attorney, Agent, or Firm*—Toler, Larson & Abel, LLP; Thomas G. Field, III

(57) ABSTRACT

Single crystal spinel boules, wafers, substrates and active devices including same are disclosed. In one embodiment, such articles have reduced mechanical stress and/or strain represented by improved yield rates.

20 Claims, 5 Drawing Sheets

U.S. PATENT DOCUMENTS

| | | | |
|---|---|---|---|
| 4,347,210 A | 8/1982 | Maguire et al. | |
| 4,370,739 A | 1/1983 | Wang et al. | |
| 4,493,720 A | 1/1985 | Gauthier et al. | |
| 4,627,064 A | 12/1986 | Auzel et al. | |
| 4,649,070 A | 3/1987 | Kondo et al. | |
| 4,657,754 A | 4/1987 | Bauer et al. | |
| 4,755,314 A | 7/1988 | Sakaguchi et al. | |
| 4,819,167 A | 4/1989 | Cheng et al. | |
| 4,963,520 A | 10/1990 | Yoo et al. | |
| 5,138,298 A | 8/1992 | Shino | |
| 5,530,267 A | 6/1996 | Brandle, Jr. et al. | |
| 5,557,624 A | 9/1996 | Stultz et al. | |
| 5,643,044 A | 7/1997 | Lund | |
| 5,644,400 A | 7/1997 | Mundt | |
| 5,654,973 A | 8/1997 | Stultz et al. | |
| 5,741,724 A | 4/1998 | Ramdani et al. | |
| 5,742,026 A | 4/1998 | Dickinson, Jr. et al. | |
| 5,768,335 A | 6/1998 | Shahid | |
| 5,802,083 A | 9/1998 | Birnbaum | |
| 5,822,213 A | 10/1998 | Huynh | |
| 5,825,913 A | 10/1998 | Rostami et al. | |
| 5,850,410 A | 12/1998 | Kuramata | |
| 5,968,267 A | 10/1999 | Li | |
| 5,982,796 A | 11/1999 | Kokta et al. | |
| 5,989,301 A | 11/1999 | Laconto, Sr. et al. | |
| 6,021,380 A | 2/2000 | Fredriksen et al. | |
| 6,023,479 A | 2/2000 | Thony et al. | |
| 6,048,577 A | 4/2000 | Garg | |
| 6,104,529 A | 8/2000 | Brandle, Jr. et al. | |
| 6,238,450 B1 | 5/2001 | Garg et al. | |
| 6,258,137 B1 | 7/2001 | Garg et al. | |
| 6,265,089 B1 | 7/2001 | Fatemi et al. | |
| 6,364,920 B1 | 4/2002 | Garg et al. | |
| 6,366,596 B1 | 4/2002 | Yin et al. | |
| 6,391,072 B1 | 5/2002 | Garg | |
| 6,406,769 B1 | 6/2002 | Delabre | |
| 6,418,921 B1 | 7/2002 | Schmid et al. | |
| 6,533,874 B1 | 3/2003 | Vaudo et al. | |
| RE38,489 E | 4/2004 | Thony et al. | |
| 6,839,362 B1 | 1/2005 | Kokta et al. | |
| 6,844,084 B1 | 1/2005 | Kokta et al. | |
| 6,846,434 B1 | 1/2005 | Akselrod | |
| 2001/0026950 A1 | 10/2001 | Sunakawa et al. | |
| 2002/0028314 A1 | 3/2002 | Tischler et al. | |
| 2002/0030194 A1 | 3/2002 | Camras et al. | |
| 2003/0007520 A1 | 1/2003 | Kokta et al. | |
| 2003/0188678 A1 | 10/2003 | Kokta et al. | |
| 2003/0190770 A1 | 10/2003 | Yeom et al. | |
| 2003/0213950 A1 | 11/2003 | Hwang | |
| 2004/0063236 A1 | 4/2004 | Kwak et al. | |
| 2004/0089220 A1 | 5/2004 | Kokta et al. | |

FOREIGN PATENT DOCUMENTS

| | | |
|---|---|---|
| CN | 1379484 | 11/2002 |
| CN | 1469459 | 1/2004 |
| CN | 1476046 | 2/2004 |
| CN | 1476047 | 2/2004 |
| EP | 0 148 656 A1 | 11/1984 |
| EP | 0 263 171 B1 | 11/1992 |
| EP | 997445 | 5/2000 |
| EP | 0 762 930 B1 | 7/2000 |
| EP | 1298709 | 4/2003 |
| EP | 1394867 | 3/2004 |
| FR | 1471976 | 3/1966 |
| JP | 53-043481 | 4/1978 |
| JP | 79-026873 | 9/1979 |
| JP | 58-090736 | 5/1983 |
| JP | 58-211736 | 12/1983 |
| JP | 61-142759 | 6/1986 |
| JP | 62-123059 | 6/1987 |
| JP | 62-188325 | 8/1987 |
| JP | 7-235692 | 9/1995 |
| JP | 07-307316 | 11/1995 |
| JP | 8-040797 | 2/1996 |
| JP | 8-083802 | 3/1996 |
| JP | 8-095233 | 4/1996 |
| JP | 9-129651 | 5/1997 |
| JP | 9-129928 | 5/1997 |
| JP | 09-278595 | 10/1997 |
| JP | 11-157997 | 6/1999 |
| JP | 11-195813 | 7/1999 |
| JP | 11-235659 | 8/1999 |
| JP | 11-274559 | 10/1999 |
| JP | 2000-228367 | 8/2000 |
| JP | 2000-331940 | 11/2000 |
| JP | 2001-010898 | 1/2001 |
| JP | 2001-198808 | 7/2001 |
| JP | 2001-220295 | 8/2001 |
| JP | 2001-253800 | 9/2001 |
| JP | 2002-012856 | 1/2002 |
| JP | 2002-050577 | 2/2002 |
| JP | 2002-158377 | 5/2002 |
| JP | 2002-255694 | 9/2002 |
| JP | 2002-353425 | 12/2002 |
| JP | 2003-045829 | 2/2003 |
| JP | 2003-113000 | 4/2003 |
| JP | 2003-124151 | 4/2003 |
| JP | 2003-165042 | 6/2003 |
| JP | 2003-273022 | 9/2003 |
| JP | 2003-320521 | 11/2003 |
| JP | 2003-334754 | 11/2003 |
| JP | 2003-338638 | 11/2003 |
| JP | 2004-006867 | 1/2004 |
| JP | 2004-014691 | 1/2004 |
| JP | 2004-140394 | 5/2004 |
| KR | 2002-043128 | 6/2002 |
| SU | 1781271 | 12/1992 |
| TW | 550836 | 9/2003 |
| WO | WO 2000/68332 | 11/2000 |
| WO | WO 01/99155 A2 | 12/2001 |
| WO | WO 02/095887 A2 | 11/2002 |
| WO | WO 2002/92674 | 11/2002 |
| WO | WO 2004/33769 | 4/2004 |

OTHER PUBLICATIONS

Yumashev, K.V., et al., "Passive Q-switching of 1.34-m neodymium laser using $Co^{2+}:LiGa_5O_8$ and $Co^{2+}:MgAl_2O_4$", Conference Digest, 2000, 1 page. XP002242959.

Oktyabrsky, S., et al., "Crystal structure and defects in nitrogen-deficient GaN", MRS Internet J. Nitride Semicond. Res, G6.43, pp. 1-6, 1999.

Kleber, W., et al., "Zur epitaxie von galliumnitrid auf nichtstochiometrischem spinell im system $GaCl/NH_3/He$", Crystal Research and Technology, vol. 10, No. 7, pp. 747-758, 1975. (English Abstract).

Seifert, A., "Nachweis von stapelfehlern in GaN-epitaxieschichten mittels elektronenbeugung", Crystal Research and Technology, vol. 10, No. 7, pp. 741-746, 1975. (English Abstract).

Ohsato, H., et al., "Epitaxial orientation and a growth model of (0 0 · 1) GaN thin film on (1 1 1 ) spinel substrate", Journal of Crystal Growth, vol. 189/190, pp. 202-207, 1998.

Yang, H. -F., et al., "Microstructure evolution of GaN buffer layer on $MgAl_2O_4$ substrate", Journal of Crystal Growth, vol. 193, pp. 478-483, 1998.

Duan, S., et al., "MOVPE growth of GaN and LEDon (1 1 1) $MgAl_2O_4$", Journal of Crystal Growth, vol. 189/190, pp. 197-201, 1998.

Sheldon, R., et al., "Cation Disorder and Vacancy Distribution in Nonstoichiometric Magnesium Aluminate Spinel, MgO · Al$_2$O$_3$", J. Am. Ceram. Soc., vol. 82, No. 12, pp. 3293-3298, 1999.

Kuleshov, N.V., et al. "Co-doped spinels: promising materials for solid state lasers", Longer Wavelength Lasers and Applications, vol. 2138, pp. 175-182, 1994. XP008017848.

Kuleshov, N.V., et al., Absorption and luminescence of tetrahedral Co$^{2+}$ ion in MgAl$_2$O$_4$, vol. 55, No. 5-6, pp. 265-269, 1993. XP008017849.

Nikishin, S.A., et al., "Gas source molecular beam epitaxy of GaN with hydrazine on spinel substrates", Applied Physics Letters, vol. 72, No. 19, pp. 2361-2363, 1998. XP000755963.

Haisma, et al., "Lattice constant adaptable crystallographics", Journal of Crystal Growth, vol. 102, pp. 979-993, 1990. XP002250056.

Tamura, K., et al., "Epitaxial growth of ZnO film on lattice-matched ScAlMgO$_4$ (0001) substrates", Journal of Crystal Growth, vol. 214-215, pp. 59-62, 2000. XP004200964.

Wyon, et al., "Czochralshi growth and optical properties of magnesium-aluminum spinel doped with nickel", Journal of Crystal Growth, vol. 79, pp. 710-713, 1986. XP002250057.

Tsuchiya, T., et al. "Epitaxial growth of InN films on MgAl$_2$O$_4$ (1 1 1) substrates", Journal of Crystal Growth, vol. 220, pp. 185-190, 2000.

Kuramata, Akito, et al., "High-quality GaN epitaxial layer grown by metalorganic vapor phase epitazy on (111) MgAl$_2$O$_4$ substrate", Appl. Phys. Lett., vol. 67, No. 17, pp. 2521-2523, 1995.

Mitchell, T., "Dislocations and Mechanical Properties of MgO—MgAl$_2$O$_3$ spinel single crystals", J. Am. Ceram. Soc., vol. 82, No. 12, pp. 3305-3316, 1999.

Hellman, E., "Exotic and Mundane substrates for gallium nitride heteroepitaxy", Bell Laboratories, THC2, Murray Hill, NJ.

Kruger, M.B., et al., "Equation of state of MgAl$_2$O$_4$ spinel to 65 GPa", The American Physical Society, vol. 56, No. 1, pp. 1-4, 1997.

Kuramata, A., et al., "Properties of GaN epitaxial layer grown on (111) MgAl$_2$O$_4$ substrate", Solid-State Electronics, vol. 41, No. 2, pp. 251-254, 1997.

Gritsyna, V., et al., "Structure and Electronic states of defects in spinel of different compositions MgO· nMgAl$_2$O$_3$: Me", J. Am. Ceram. Soc. vol. 82. No. 1, pp. 3365-3373, 1999.

Efimov, A.N., et al., "On an Unusual Azimuthal Orientation Relationship in the System Gallium Nitride Layer on Spinel Substrate", Crystallography Reports, 45(2): 312-317 (2000).

Sun C.J., et al., "Mg-doped green light emitting diodes over cubic (1 1 1) MgAl2O4 substrate", App. Phys. Lett. 72(19): 2361-2363 (1998).

Efimov, A.N., et al., "Symmetry constraints and epitaxial growth on non-isomorphic substrate", Thin Solid Films 260: 111-117 (1995).

George, T., et al., "Novel symmetry in the growht of gallim nitride on magnesium aluminate substrates", Appl. Phys. Lett. 68(3): 337-339 (1996).

Sun C.J., et al., "Deposition of high quality wurtzite GaN films over cubic (1 1 1) MgAl2O4 substrates using low pressure and metalorganic chemical vapor deposition," Appl. Phys. Lett. 68(8): 1129-1131 (1996).

Nakamura, S., et al., "Characteristics of InGaN multi-quantum-well-structure laser diodes," Appl. Phys. Lett. 68(23): 3269-3271 (1996).

Khan, M.A., et al., "Cleaved cavity optically pumped InGaN—GaN laser grown on spinel substrates," Appl. Phys. Lett. 69(16): 2418-2420 (1996).

Tempel, A., et al., "Nachweis von Stapelfehlem in GaN-Exitaxieschichten mittels Elecktronenbeugung," Kristall Und Technik 10(7): 741-746 (1975).

Tempel, A., et al., "Zur Epitaxie von Galliumnitride auf nichtstoechiometrischem Spinell im System GaC1/NH3/He," Kristall Und Technick 10(7): 747-758 (1975).

K.V. Yumashev, "Saturable absorber Co2+: MgAl2O3 crystal for Q switching of 1.34-um Nd3+: YAIO3 and 1.54-um Er3+: glass lasers," Applied Optics 38(30): 6343-6346 (1999).

Giess et al., "Growth of Single Crystal MgGa2O4 Spinel", IBM Technical Disclosure Bulletin, vol. 15, No. 1, Jun. 1972, pp. 151-152, XP-002315746.

Anon., "Spinel Crystals for Electronic Devices", Manufacturing Technology Note, vol. NTN-77, No. 0735, Apr. 1977, XP-002315747.

Grabmaier et al., "Czochralski Growth of Magnesium-Aluminum Spinel", J. American Ceramic Society, vol. 51, No. 6, Jun. 1968, pp. 355-356, XP-002315185.

Wyon et al., "Czochralski Growth and Optical Properties of Magnesium-Aluminum Spinel Doped with Nickel", Journal of Crystal Growht, North-Holland Publishing Co. Amsterdam, NL, vol. 79, No. 1-3, part 2, 1986, pp. 710-713, XP-002250057.

Pinckney, L.R., "Transparent, high strai point spinel glass-ceramics", Journal of Non-Crystalline Solids, vol. 255, pp. 171-177, 1999.

Nakamura, S. "Current Status and Furture Prospects of InGaN-Based Laser Diodes", ISAP International, vol. 1, pp. 5-17, 2000.

Kisailus D., et al., "Growth of Epitaxial GaN of LiGaO2 Substrates Via a Reaction With Ammonia", J. Mater. Res., vol. 16, No. 7, pp. 2077-2081, 2001.

Nakamura, S., et al., "InGaN MQW LDs Grown on MgAl2O4 Substrates," In the Blue Laser Diode, (NY: Springer-Verlag), pp. 233-243, 1997 (update included).

Mordoc, H., et al., "Large-band-gap SiC, III-V nitride, and II-vi ZnSe-based Semiconductor Device Technologies", J. Appl. Phys., vol. 76, No. 3, pp. 1363-1398, 1994.

Yumashev, K.V., et al., "Nonlinear spectroscopy and passive Q-switching operation of a Co2+: LaMgAl11O19 crystal," J. Opt. Soc. Am. B., 16(12): 2189-2194 (1999).

Camargo, M.B., et al., "Co2+ Y3Sc2Ga3O12 (YSGG) Passive Q-Switch for infared Erbium Lasers," submitted to LEOS in 1994.

Mikhailov, V.P., et al., "Passive Q-switch performance at 1.3u (1.5u) and nonlinear spectroscopy of Co2+: MgAl2O4 and Co2+: LaMgAl11O9 cyrstals," OSA TOPS vol. 26 Advanced Solid-State Lasers, pp. 317-324 (1999).

Stulz, R.D., et al., "Diavalent Uranium and Cobalt Saturable Absorber Q-Switches at 1.5um," OSA Proceedings on Advanced Solid-State Lasers, 24:460-464 (1995).

Bimbaum, M., et al., "Co2+: ZnSe Saturable Absorber Q-Switch for the 1.54 Um Er3+: Yb3+: Glass Laser," OSA TOPS vol. 10 Advanced Solid State Lasers, pp. 148-151 (1997).

Machida, H., et al., "difficulties encoutered during the Czochralxki growth of TiO2 single crystals," Journal of Cyrstal Growth, 112: 835-837 (1997).

Camargo, M.B., et al., "Broad-band 1.54 um Saturable Absorber Q-switch with Co2+," submitted to ASSL in 1995.

Aeschlimann, R. et al., "The Chemical Polishing of Magnesium Aluminate Spinel in Pyrophosphoric Acid", Mat. Res. Bull., vol. 5, pp. 167-172, 1970.

Dwikusuma, F., "Study on Sapphire Surface Preparation for III-Nitride Heteroepitaxial Growth by Chemical Treatments", Journal for Electrochemical Soc., Nov. 2002, 30 pgs.

Kim, S. et al., "Stress Relaxation in Thick-Film GaN Grown by Hydride Vapor Phase Epitaxy on Sapphire and Spinel Substrates as Studied by Photoluminescence and Raman Spectroscopy", J. of the KR Phys Soc., vol. 34, No. 2, Feb. 1999, pp. 163-167.

Kurobe, Toshiji, et al., "Magnetic Field-Assisted Lapping", Bull. Japan Soc. of Prec. Engg., vol. 20, No. 1, Mar. 1986, pp. 49-51.

Libowitzky, E., "Optical Anisotropy in the Spinel Group: a Polishing Effect", Eur. J. Mineral., vol. 6, 1994, pp. 187-194.

Reisman, A., et al., "The Chemical Polishing of Sapphire and MgAl Spinel", J. Electrochem. Soc.: Solid State Science, vol. 118, No. 10, Oct. 1971, pp. 1653-1657.

Richter, F., et al., "Herstellung und Aurichtung Von MgAl-Spinell-Substraten fur die Halbleiterepitaxie", Kristall Und Technik, vol. 10, No. 3, 1975, pp. 33-348.

Robinson, P., et al., "The Chemical Polishing of Sapphire and Spinel", RCA Review, vol. 34, Dec. 1973, pp. 616-629.

Roy, D., et al., "Spinel, Where did it go?", SPIE vol. 3134, pp. 307-316.

Wang, C., et al., " Growth and Characterization of Spinel Single Crystal for Substrate Use in Integrated Electronics", J. Applied Physics, vol. 40, No. 9, Aug. 1969, pp. 3433-3444.

Yanina, S., et al., "Moving Steps and Crystal Defects on Spinel Surfaces", Mat. Res. Soc. Symp., vol. 620, 2000, pp. M9.4.1-M9.4.6.

Byun, D., et al., "Reactive ion (N2+) Beam Pretreatment of Sapphire for GaN Growth", Thin Solid Films, vol. 326, 1998, pp. 151-153.

Byun, D., et al., "New Pretreatment Method of Sapphire for GaN Deposition", Phys. Stat. Sol., vol. 176, 1999, pp. 643-648.

Sung, Y., et al., "High Rate Etching of Sapphire Wafer Using Cl2BCl3 Ar Inductively Coupled Plasmas", Mat. Sci. & Eng.: Sold State Mat, vol. B82, No. 1-3 2000, pp. 50-52. (Abstract Only).

Wang, X., et al., "Chemical Polishing of Sapphire for Growth of GaN", Chinese Journal of Semiconductors, vol. 18, No. 11, pp. 867-871, 1997. (Abstract Only).

Lee, J., et al., "Scribing and Cutting a Blue LED Wafer Using a Q-Switched Nd:YAG Laser", Appplied Physics, vol. 70, No. 5, pp. 561-564, 2000. (Abstract Only).

Kalinski, Z., "Preparation of Sapphire Substrates for Gas Phase GaN Epitaxial Processes", Kristal Und Technik, vol. 12, No. 10, pp. 1105-1110, 1977. (Abstract Only).

Jeong, C., et al., "Sapphire Etching with BC13/HBr/Ar Plasma", Surface & Coatings Technology, vol. 171, No. 1-3, 2003, pp. 280-284. (Abstract Only).

Kalinski, Z., et al., "Structural Etching of Al2O3 Substrate Plates Applied in Gaseous Epitaxy of GaN Layers", Elektronika, vol. 18, No. 3, 1977, pp. 117-119. (Abstract Only).

Lakew, B., et al., "High Tc Superconducting Bolometer on Chemically Etched 7 Micrometer Thick Sapphire", NASA, 1997, 21 pgs. (Abstract Only).

Jeong, C., et al., "Dry Etching of Sapphuire Substrate for Device Separation in Chlorine-Based Inductively Coupled Plasmas", Mat. Sci. & Eng.: Solid State Materials, vol. 93, No. 1-3, pp. 60-63, 2002. (Abstract Only).

Gu, E., et al., "Micromachining and Dicing of Sapphire, Gallium Nitride and Micro LED Devices with UV Copper Vapour Laser", Thin Solid Films, vol. 453-454, pp. 462-466, 2000. (Abstract Only).

Park, H., et al., "A Novel Process for the Generation of Pristine Saphire Surfaces", Thin Solid Films, vol. 422, No. 1-2, pp. 135-140, 2000. (Abstract Only).

Fenner, D., et al., "Ion Beam Nanosmoothing of Sapphire and Silicon Carbide Surfaces", SPIE, vol. 4468, pp. 17-24, 2001. (Abstract Only).

Blecha, Z., et al., "On Fabrication of Sapphire Substrates (1102) for Epitaxy of Monocrystalline Silicon", Jemna Mechanika A Optika, vol., 28, No. 12, pp. 249-351, 1983. (Abstract Only).

Duffy, M., et al., "Optical Characterization of Silicon and Sapphire Surfaces as related to SOS Discrete Device Performance", Journal of Crystal Growth, vol. 58, No. 1, pp. 19-36, 1982. (Abstract Only).

Ehman, M., et al., "Mechanical Preparation of Sapphire Single-Crystal Surfaces by Vibratory Techniques", Metallography, vol. 9, No. 4, pp. 333-339, 1976. (Abstract Only).

Druminiski, M., et al., "Deposition of Epitaxial Films on Spinel and Sapphire. Influence of Substrate Preparation", Siemens Forschungs—Und Entwicklungsberichte, vol. 5, No. 3, pp. 139-145, 1976. (Abstract Only).

Cullen, G., "The Preparation and Properties of Chemically Vapor Deposited Silicon on Sapphire and Spinel", Journal of Crystal Growth, vol. 9, pp. 107-125, 1971. (Abstract Only).

Liu, L., et al., "Substrates for Gallium Nitride Epitaxy", Mat. Sci. & Eng. Reports, vol. R37, No. 3, pp. 61-127, 2000. (Abstract Only).

Khattak, C., et al., "Production of Sapphire Blanks and Substrates for Blue LEDs and LDs", Mat. Res. Soc. Symp.— Proceedings, V. 743, pp. 219-224, 2002. (Abstract Only).

Gutsche, H., et al., "Polishing of Sapphire with Colloidal Silica", Journal of the Electrochemical Society, vol. 125, No. 1, 1978, pp. 136-138, 1978. (Abstract Only).

Duffy, M., et al., "Semiconductor Measurement Technology: Method to Determine the Quality of Sapphire, (NOTE) Final Report", RCA Labs, 1980, 77 pgs. (Abstract Only).

Duffy, M., et al, "Method to Determine Qulity of Sapphire, (NOTE) Interim Rept.", RCA Labs, 1975, 88 pgs. (Abstract Only).

Horie, S., et al., "Precision Grinding of Semiconductor—Related Materials", (JOURNAL) New Diamond, vol. 20, No. 2, pp. 8-13, 2004. (Abstract Only).

Edgar, J., et al., "Substrates for Gallium Nitride Epitaxy", Mat. Sci. & Eng., Part R, vol. R37, No. 3, pp. 61-127, 2002. (Abstract Only).

Author Unkown, "Specifications for Polished Monocrystalline Sapphire Substrates" 1996, Affiliation (Issuing Organization) SEMI Semiconductor Equipment & Materials International, USA. (Bibliographic Entry Only).

Search Report for Technical Articles (Including various Abstracts of certain Identified References).

* cited by examiner

SPINEL ARTICLES AND METHODS FOR FORMING SAME

CROSS-REFERENCE TO RELATED APPLICATION(S)

BACKGROUND

1. Field of the Invention

The present invention is generally directed to articles having a spinel crystal structure, and includes articles such as boules, wafers, substrates, and active devices incorporating same. In addition, the present invention relates generally to methods for forming such articles.

2. Description of the Related Art

Active optoelectronic devices, such as light-emitting diodes (LEDs) and laser diodes oftentimes will utilize nitride-based semiconductor layers for the active layer of the device. In this regard, the family of gallium nitride (GaN) materials, which broadly includes Ga(Al, In)N materials, have been utilized as a direct transition-type semiconductor material having a band gap that may be manipulated over a fairly wide range, on the order of about 2 to 6 eV.

In order to take advantage of the optoelectronic characteristics of such nitride-based semiconductor materials, they generally are formed as a single crystal. In this regard, it is generally not pragmatic to form bulk monocrystalline boules of nitride-based semiconductor material. Accordingly, the industry typically has sought to deposit such materials as a monocrystalline layer, such as by epitaxial growth, on an appropriate substrate. It is desired that the substrate on which the nitride-based semiconductor layer is deposited has a compatible crystal structure, to manifest the desired crystal structure in the as-deposited active layer. While such nitride-based materials, such as GaN and AlN can exist in several different crystal states, typically the desired crystal structure is wurtzite rather than zinc blende. In an effort to closely match the desired wurtzite crystal structure, the art has utilized monocrystalline alumina in the form of sapphire (corundum), and specifically oriented the sapphire substrate so as to provide an appropriate crystallographic surface on which the active layer is deposited. However, sapphire suffers from numerous drawbacks. For example, sapphire does not exhibit a cleavage plane that can be used to fabricate active devices. In this regard, it is generally desirable to dice the wafer into individual die (forming active devices, each having a device substrate) by cleavage rather than by slicing or sawing, as cleavage may reduce manufacturing costs and may simplify the manufacturing process.

In contrast, materials having the spinel crystallographic structure, if oriented properly, demonstrate a cleavage plane, the projection of which in the surface of the wafer is generally parallel to a cleavage plane of the nitride active layer, which permits predictable and reliable device fabrication. Despite the technical superiority of spinel over sapphire, a number of processing hurdles exist, resulting in somewhat limited economic feasibility. While the industry has sought to create spinel substrates by a technique known as flame fusion, the so called "Verneuil" technique, such a technique is relatively difficult to carry out, and extremely high processing temperatures have been traced to compositional inhomogeneities in the formed boule.

The industry has also sought to develop single crystalline spinel boules from melt-based process techniques, which include techniques such as the so-called Czochralski technique, among others. In such melt-based techniques, generally a stoichiometric crystal (typically $MgO \cdot Al_2O_3$, having an $MgO:Al_2O_3$ ratio of 1:1) is grown from a batch melt, rather than flame-melted that involves solidification on a solid surface. While melt-based techniques have shown much promise for the creation of single-crystal spinel substrates, the process is relatively difficult to control, and suffers from undesirably low yield rates, increasing costs. In addition, extended cooling periods and annealing periods are carried out to remove residual internal mechanical strain and stress present in the boules following boule formation. Such cooling rates may be unusually low, and cooling periods significantly long, affecting throughput and increasing thermal budget and cost. In a similar manner, the extended annealing times, which may range into the hundreds of hours, further increase processing costs.

Still further, even beyond the relatively high processing costs and despite the precautions taken in an attempt to address residual mechanical strain and stress in the crystal, oftentimes the wafers formed from boules tend to suffer from undesirably high failure rates, with frequently lower than 20% yield rates.

In view of the foregoing, it is generally desirable to provide improved spinel boules, wafers, substrates, and optoelectronic devices incorporating same, as well as improved methods for forming same.

SUMMARY

According to a first aspect of the present invention, a single crystal spinel boule is formed by melt processing. The boule has a non-stoichiometric composition and has a reduced mechanical stress. The reduced mechanical stress is represented by a relatively high yield rate, generally not less than about 20%. Yield rate is defined by $w_i/(w_i+w_f) \times 100\%$, where $w_i$ equals the number of intact wafers processed from the boule, and $w_f$ equals the number of fractured wafers from the boule due to internal mechanical stress or strain in the boule.

According to another aspect of the present invention, a single crystal spinel wafer is formed by melt processing, the wafer having a non-stoichiometric composition and having a reduced internal stress. The reduced internal stress is represented by a yield rate not less than about 20%. Yield rate is defined as above, namely $w_i/(w_i+w_f) \times 100\%$, wherein $w_i$ equals the number of intact wafers processed from the boule, and $w_f$ equals the number of fractured wafers from the boule due to mechanical stress or strain in the boule.

According to another aspect of the present invention, an optoelectronic substrate is provided, consisting essentially of $aMgO \cdot bAl_2O_3$ single crystal spinel, wherein a ratio of b:a is greater than 1:1 such that the spinel is rich in $Al_2O_3$ and the single crystal spinel is formed by a melt process.

According to another aspect, a device is provided, which includes a non-stoichiometric spinel substrate formed by melt processing, and an active layer overlying the substrate.

According to another aspect of the present invention, a method for forming single crystal spinel wafers is provided, which includes providing a batch melt in a crucible, growing a spinel single crystal boule from the melt, restricting annealing to a time period not greater than about 50 hours, and slicing the boule into a plurality of wafers.

According to another aspect of the present invention, a method for forming single crystal spinel wafers is provided, including providing a batch melt in a crucible, growing a single crystal spinel boule from the melt, and slicing the boule into a plurality of wafers. In this embodiment, the boule is grown at a process aspect ratio of not less than about 0.39, the process aspect ratio being defined as a ratio of average boule diameter to crucible inside diameter.

According to another aspect of the present invention, a method for forming single crystal spinet wafers is provided, including providing a batch melt in a crucible, growing a spinet single crystal boule from the melt, cooling the boule at a cooling rate not less than about 50° C./hour, and slicing the boule into a plurality of wafers.

According to another aspect of the present invention, a method for forming single crystal spinet wafers is provided, including providing a batch melt in a crucible, growing a spinet single crystal boule from the melt, cooling the boule at a cooling rate not less than about 50° C./hour, restricting annealing to a time period not greater than about 50 hours, and slicing the boule into a plurality of wafers. During the growing step, the boule is grown at a process aspect ratio of not less than about 0.39, wherein process aspect ratio is defined as a ratio of average boule diameter to crucible inside diameter.

DETAILED DESCRIPTION

According to one aspect of the present invention, a single crystal spinel boule and single crystal spinel wafers formed therefrom are provided. Typically, processing of a single crystal spinel boule begins with the formation of a batch melt in a crucible, generally illustrated as step 210 in FIG. 11. The batch melt is generally provided to manifest a non-stoichiometric composition in the as-formed boule. According to one embodiment, the boule has a general formula of $aAD \cdot bE_2D_3$, wherein A is selected from the group consisting of Mg, Ca, Zn, Mn, Ba, Sr, Cd, Fe, and combinations thereof, E is selected from the group consisting Al, In, Cr, Sc, Lu, Fe, and combinations thereof, and D is selected from the group consisting O, S, Se, and combinations thereof, wherein a ratio b:a>1:1 such that the spinel is rich in $E_2D_3$. For clarification, a stoichiometric composition is one in which the ratio of b:a=1:1, while non-stoichiometric compositions have a b:a ratio≠1:1.

As used herein, the term 'boule' refers to a single crystal mass formed by melt processing, and includes ingots, cylinders, or the like structures.

Figure 1:
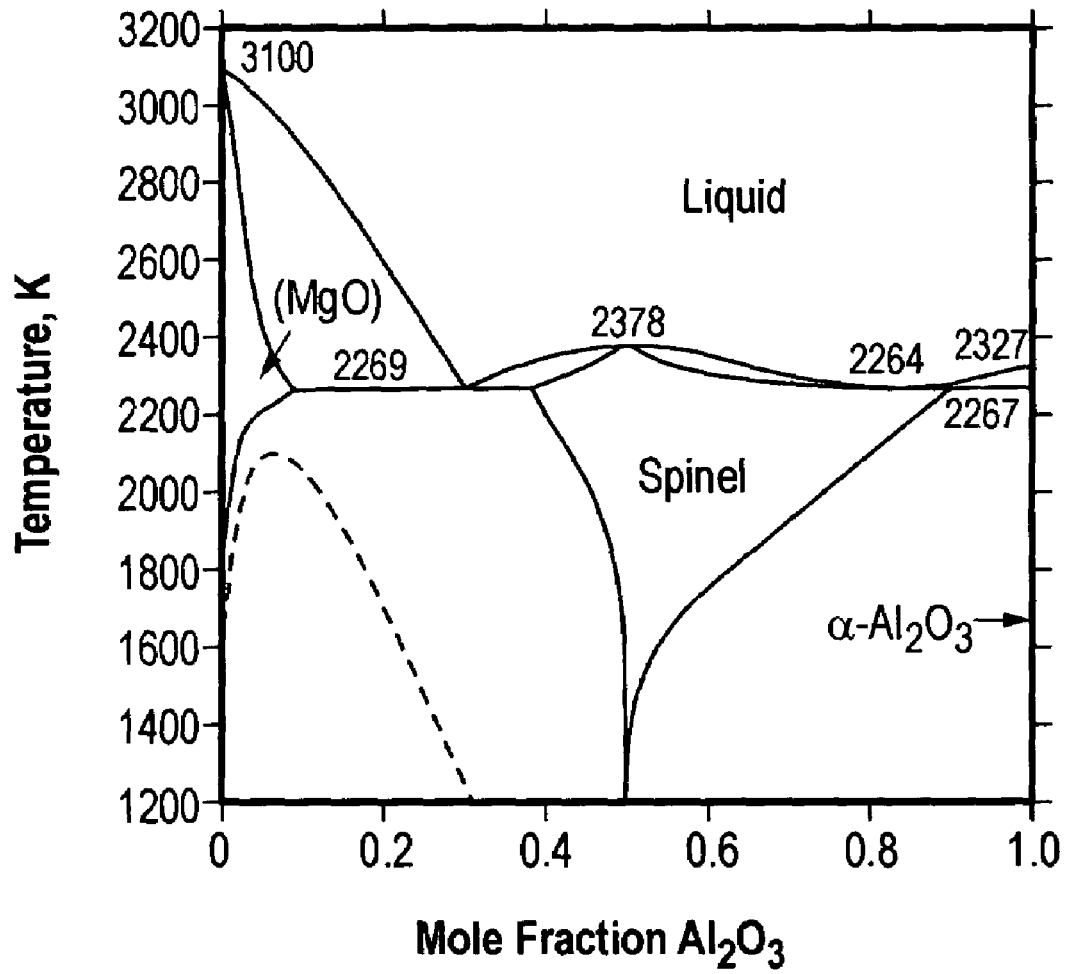
FIG. 1 is a phase diagram of the MgO—$Al_2O_3$ system.

According to certain embodiments, A is Mg, D is O and E is Al, such that the single crystal spinel has the formula $aMgO \cdot bAl_2O_3$. While some of the disclosure contained herein makes reference to the MgO—$Al_2O_3$ spinel based-compositions, it is understood that the present disclosure more generally relates to a broader group of spinel compositions, having the generalized formula $aAD \cdot bE_2D_3$, as described above. With respect to the MgO—$Al_2O_3$ system, attention is drawn to FIG. 1, illustrating a binary phase diagram of MgO—$Al_2O_3$. As illustrated, as the alumina content of $aMgO \cdot bAl_2O_3$ increases beyond a ratio of b:a of 1:1 representing the stoichiometric $MgO \cdot Al_2O_3$ composition, the liquidus temperature decreases. Accordingly, melting may be accomplished at relatively low temperatures. For example, the melt temperature utilized for boule formation in the alumina-rich spinel may be on the order of 50 to 100 degrees lower than the usable melt temperature for stoichiometric spinel. It is noted that stoichiometric spinel having a composition represented by $MgO \cdot Al_2O_3$ (b:a=1:1) has a liquidus temperature of about 2378 K, while a ratio of b:a of 4:1 as a liquidus temperature notably lower, about 2264K.

While $E_2D_3$-rich spinels are generally represented by a ratio b:a greater than 1:1, certain embodiments have a b:a ratio not less than about 1.2:1, such as not less than about 1.5:1. Other embodiments have even higher proportions of $E_2D_3$ relative to AD, such as not less than about 2.0:1, or even not less than about 2.5:1. According to certain embodiments, the relative content of $E_2D_3$ is limited, so as to have a b:a ratio not greater than about 4:1. Specific embodiments may have a b:a ratio of about 3:1 (e.g., 2.9:1).

Following formation of a batch melt in a crucible, typically, the spinel single crystal boule is formed by one of various techniques such as the Czochralski pulling technique. While the Czochralski pulling technique has been utilized for formation of certain embodiments herein, it is understood that any one of a number of melt-based techniques, as distinct from flame-fusion techniques, may be utilized. Such melt-based techniques also include the Bridgman method, the liquefied encapsulated Bridgman method, the horizontal gradient freeze method, and edge-defined growth method, the Stockberger method, or the Kryopolus method. These melt-based techniques fundamentally differ from flame fusion techniques in that melt-based techniques grow a boule from a melt. In contrast, flame fusion does not create a batch melt from which a boule is grown, but rather, provides a constant flow of solid raw material (such as in powder form) in a fluid, to a hot flame, and the molten product is then projected against a receiving surface on which the molten product solidifies.

Figure 11:
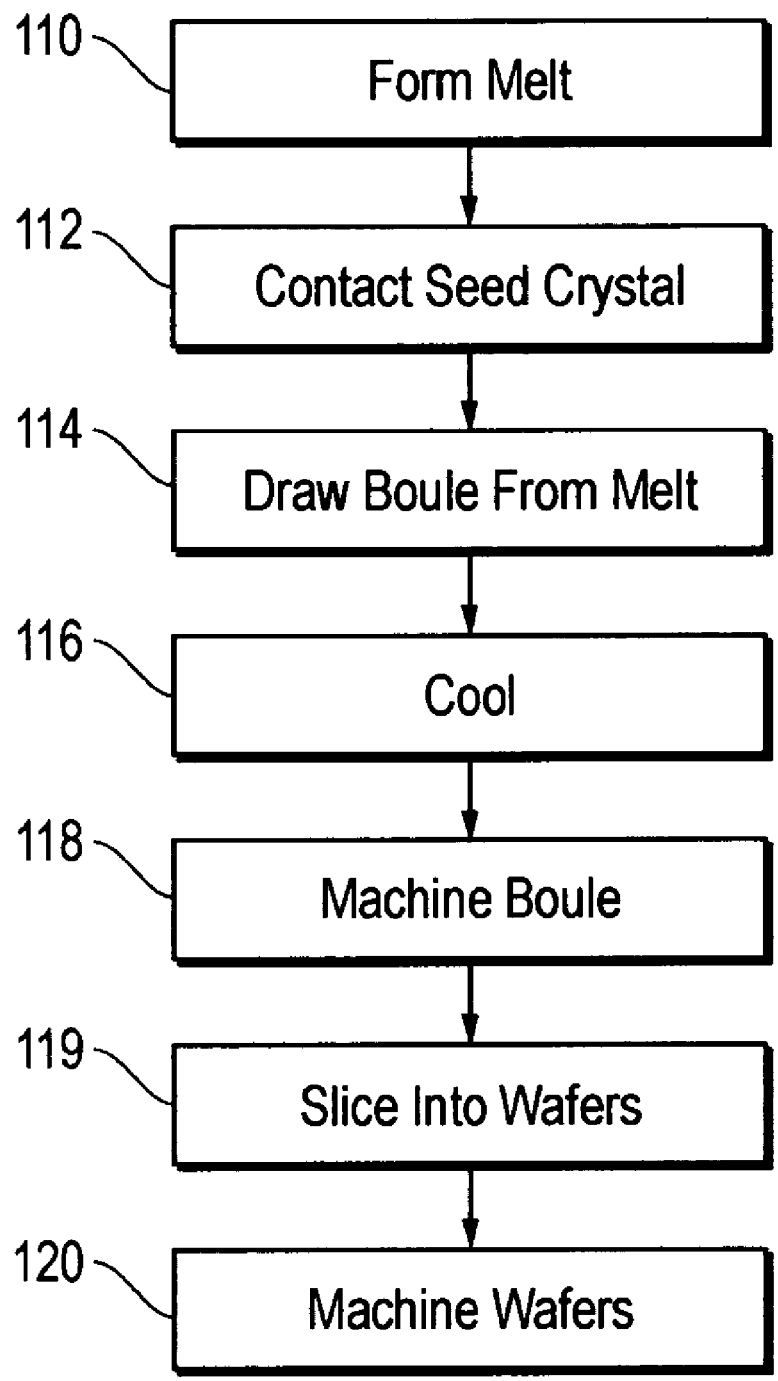
FIG. 11 shows a process flow diagram according to an aspect of the present invention.

Generally, the single seed crystal is contacted with the melt at step 212 in FIG. 11, while rotating the batch melt and the seed crystal relative to each other. Typically, the seed crystal is formed of stoichiometric spinet and has sufficiently high purity and crystallographic homogeneity to provide a suitable template for boule growth. The seed crystal may be rotated relative to a fixed crucible, the crucible may be rotated relative to a fixed seed crystal, or both the crucible and the seed crystal may be rotated. During rotation, the seed crystal and the actively forming boule are drawn out of the melt in step 214 in FIG. 11.

According to one embodiment of a present invention, average boule diameter and interior crucible diameter of the crucible containing the batch melt are controlled to be within certain parameters. Most typically, the single crystal boule is grown at a process aspect ratio of not less than about 0.39. Here, process aspect ratio is defined as a ratio of average boule diameter to crucible diameter. Average boule diameter is the average diameter of the boule along its nominal length, nominal length representing that portion of the boule that is utilized for formation of wafers according to downstream processing steps, generally not including the neck and tail (conical-shaped end caps at opposite ends of the boule).

Typically, boule diameter is relatively constant along the nominal length of the boule. Formation at the minimum process aspect ratio helps ensure against unwanted or undesirable crystallographic orientation or re-orientation of the boule, also known as 'flipping'. More specifically, it is desired that the boule have the <111> orientation (triangular morphology), rather than the <110> orientation (square or hexagonal morphology), and sufficiently high aspect ratios may ensure against flipping from the <111> crystallographic orientation to the <110> crystallographic orientation.

Figure 2:
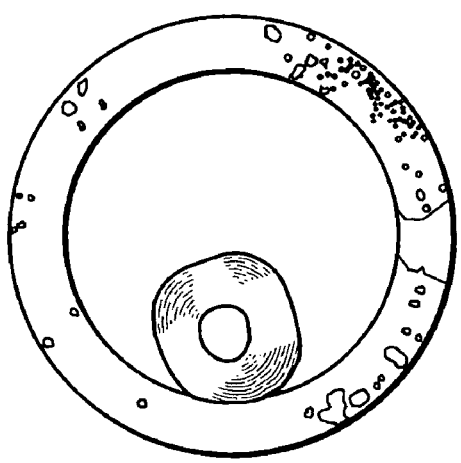
FIG. 2 is a photograph of a front view of a small diameter (2-inch) boule grown in a 7-inch diameter crucible.
Figure 3:
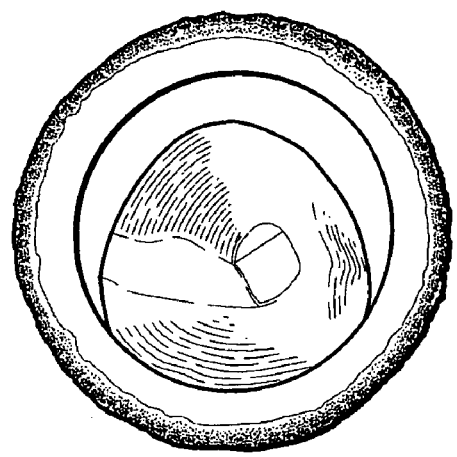
FIG. 3 is a photograph of a front view of a large diameter (4-inch) boule grown in a 7-inch diameter crucible.
Figure 4:
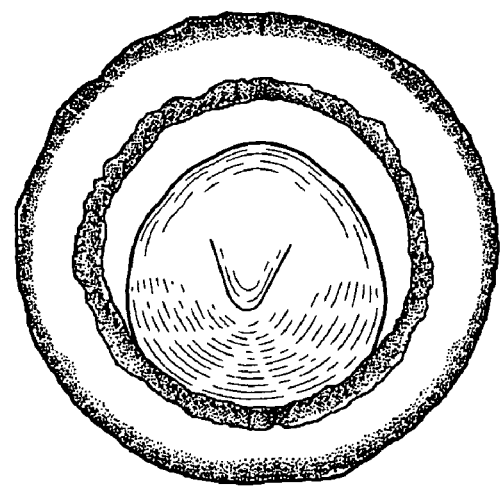
FIG. 4 is a photograph of a front view of a 2-inch diameter boule grown in a 4-inch diameter crucible.
Figure 5:
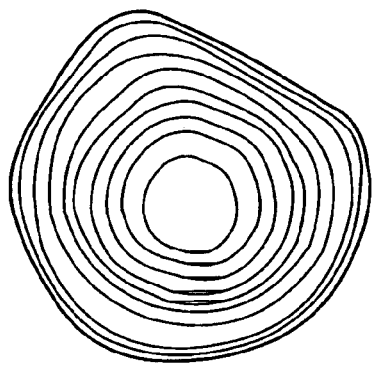
FIGS. 5 and 6 are front and side views respectively of a mis-oriented (flipped) crystal.
Figure 6:
Figure 7:
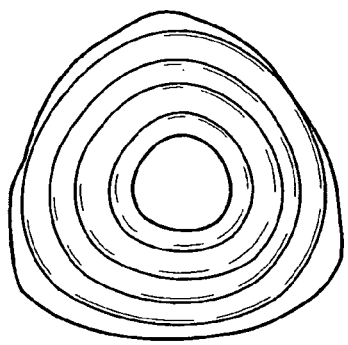
FIGS. 7 and 8 are front and side view photographs of a good [111] crystal.
Figure 8:
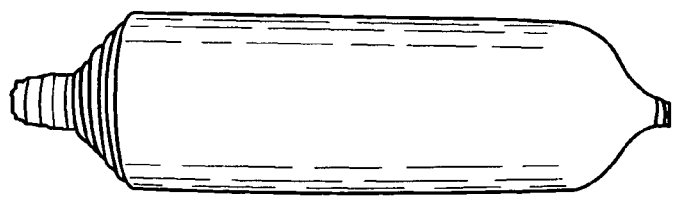

Actual photographs of both desirably oriented <111> boules and "flipped" boules, and the relationship of aspect ratio to crystal orientation, are shown in FIGS. 2–8 and the Table below. FIG. 2 represents a mis-oriented (flipped) single crystal boule formed according to a process aspect ratio of about 0.28 (2 inch boule diameter, 7 inch crucible diameter), while FIGS. 3 and 4 illustrate good <111> single crystal boules formed according to a process aspect ratios of 0.57 (4 inch boule diameter, 7 inch crucible diameter) and 0.50 (2 inch boule diameter, 4 inch crucible diameter). According to embodiments of the present invention, FIGS. 5 and 6 show end and perspective views of another mis-oriented (flipped) boule while FIGS. 7 and 8 illustrate a good <111> single crystal boule.

With respect to the MgO—$Al_2O_3$ system, multiple samples were created based upon a 3:1 (2.9:1) b:a ratio, and a summary of the relevant process conditions is provided below in the table. Certain embodiments of the present invention have somewhat higher minimum process aspect ratios, such as not less than about 0.40, not less than about 0.42, or even not less than about 0.43. Other embodiments have even higher process aspect ratios such as not less than about 0.44, or even greater.

TABLE

| Pull rate (mm/hr) | Crucible ID (inches) | Crucible lid ID (inches) | Crystal dia. (inches) | Result, <111> | Aspect Ratio |
|---|---|---|---|---|---|
| 1 | 4 | 2.5 | 2.2 | yes | 0.55 |
| 1 | 5 | 3.5 | 2.2 | no | 0.44 |
| 1 | 6 | 4.5 | 2.2 | no | 0.37 |
| 1 | 7 | 5.25 | 2.2 | no | 0.31 |
| 1 | 7 | 5.25 | 4.1 | yes | 0.59 |
| 1 | 6 | 4.5 | 3.1 | yes | 0.52 |
| 2.5 | 5 | 3.5 | 2.2 | yes | 0.44 |
| 2.5 | 6 | 4.5 | 2.2 | no | 0.37 |
| 2.5 | 7 | 4 | 3.1 | yes | 0.44 |
| 2.5 | 6 | 2.75 | 2.2 | partly | 0.37 |

Typically, the boule consist essentially of a single spinel phase, with no secondary phases. According to another feature, the boule and the wafers processed therefrom are free of impurities and dopants. According to one embodiment, the wafers are processed into device substrates for optoelectronic applications, the wafer and substrates having a composition consisting essentially of $aMgO \cdot bAl_2O_3$, wherein a ratio of b:a is greater than 1:1. In this regard, impurities and dopants are generally precluded. For example, Co is restricted from inclusion in the foregoing embodiment, which otherwise is a dopant for Q-switch applications. In contrast to Q-switch applications, it is generally desired that a relatively pure spinel is utilized substantially free of dopants that affect the basic and novel properties of the device substrates.

According to embodiments of the present invention, a single crystal spinel boule is formed having desirable properties. In addition to the desired <111> orientation described above, the boules, wafers, and device substrates formed therefrom also generally have reduced mechanical stress and/or strain, as compared to a stoichiometric articles having a b:a ratio of 1:1. In this regard, embodiments of the present invention provide desirably high yield rates in connection with formation of single crystal wafers that form substrates of active devices, and also provide improved processing features, discussed in more detail hereinbelow.

With respect to improved processing features, the boule may be cooled at relatively high cooling rates such as not less than about 50° C./hour, at step 216 in FIG. 11. Even higher cooling rates may be utilized according to embodiments of the present invention, such as not less than about 100° C./hour, 200° C./hour and even at a rate of greater than about 300° C./hour. The increased cooling rates desirably improve throughput of the fabrication process for forming single crystal boules and further reduce the thermal budget of the entire fabrication, and accordingly reduce costs. Boules formed according to conventional processing generally are cooled at relatively low cooling rates, in an attempt to prevent fracture during the cooling process. However, according to embodiments of the present invention, the cooling rates may be substantially higher yet still provide intact boules in the as-cooled form. Generally, conventional cooling rates are on the order of 40° C./hour or less, requiring cooling periods on the order of days.

Still further, according to another embodiment of the present invention, annealing of the boule, conventionally carried out subsequent to cooling, is restricted to a relatively short time period. Typically, the time period is not greater than about 50 hours, such as not greater than about 30 hours, or even 20 hours. According to certain embodiments, the annealing is restricted to a time period not greater than about 10 hours. Indeed, annealing may be substantially completely eliminated (illustrated by lack of an anneal step in FIG. 11), thereby obviating post-forming heat treatment. In contrast, conventional boule forming technology generally requires use of substantial anneal periods in an attempt to mitigate residual internal stress and strain, responsible for low wafer yield rates as well as boule fracture. Without wishing to be tied to any particular theory, it is believed that the reduction and internal stress and strain in the boule according to embodiments herein permits such flexible processing conditions, including decreased or complete elimination of annealing periods, as well as increased cooling rates as noted above.

According to another feature, the reduction in internal mechanical stress and strain are quantified by yield rate, the number of intact wafers formed by slicing the boule, such as by step 219 in FIG. 11. Typically, slicing is carried out by any one of several slicing techniques, most notably wire sawing. As used herein, yield rate may be quantified by the formula $w_i/(w_i+w_f) \times 100\%$, wherein $w_i$=the number of intact wafers processed from the boule, and $w_f$=the number of fractured wafers from the boule due to internal mechanical stress or strain in the boule. Conventionally, this yield rate is very low, such as on the order 10%. The unacceptably low yield rate is a manifestation of excessive internal stresses and strain in the boule. In contrast, yield rates according to embodiments of the present invention are typically not less than about 25%, 30% or even 40%. Other embodiments show increasingly high yield rates, such as not less than about 50, 60 or even 70%. Indeed, certain embodiments have demonstrated near 100% yield. This reduce internal mechanical stress and/or strain as quantified above is not only present within the as-formed (raw) boules, but also the processed boules, the wafers sliced from boules, and the device substrates cleaved from the wafers. In this regard, the foregoing description of processed boules generally denotes boules that have been subjected to post-cooling machining steps as generally denoted by step 218 in FIG. 11, such as grinding, lapping, polishing and cleaning.

Following slicing, the wafers may be further processed such as by machining at step 220 in FIG. 11. The wafers have a generally sufficient diameter and associated surface area to provide reduced processing costs for the active device manufacturer, in a manner similar that increased wafer size reduces semiconductor die cost in the semiconductor fabrication field. Accordingly, it is generally desired that the wafers have a nominal diameter of not less than about 1.75 inches, generally not less than about 2.0 inches and in certain embodiments, 2.5 inches or greater. Current state-of-the art processing tools for handling wafers in active device fabrication are geared to handle two inch wafers, and processing equipment for handling three inch wafers are presently coming on-line. In this regard, due to processing features and wafer features described herein, next-generation wafers may be supported according to embodiments of the present invention.

Figure 9:
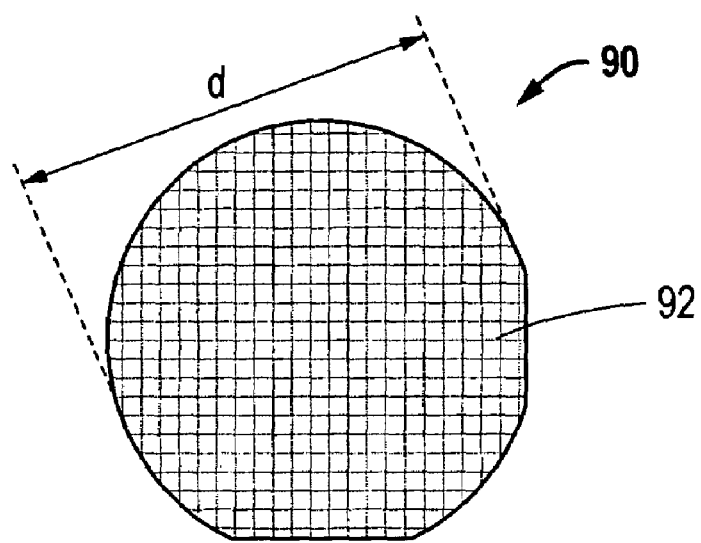
FIG. 9 illustrates a wafer having a diameter d, and having numerous device substrates or die.

FIG. 9 illustrates a wafer according to an embodiment of the present invention, most notably wafer 90 having a plurality of die 92 that form individual device substrates for active devices. As shown, the wafer has a diameter d in accordance with the foregoing description relating to wafer diameter. Typically, the individual device substrates or die 92 are separated from the wafer 90, subsequent to wafer processing, to form individual active devices. In contrast to semiconductor manufacturing in which individual die are typically formed by a sawing operation along kerf lines, the individual active components may be cleaved from the wafer along cleavage planes of the wafer and the overlying active layer, which cleavage planes are generally oriented non-parallel to the plane of the wafer. Generally, the surface of the wafer that is processed has a desirable crystallographic orientation, namely the <111> crystallographic orientation, which is suitable for epitaxial growth of Ga(Al, In)N active materials.

Figure 10:
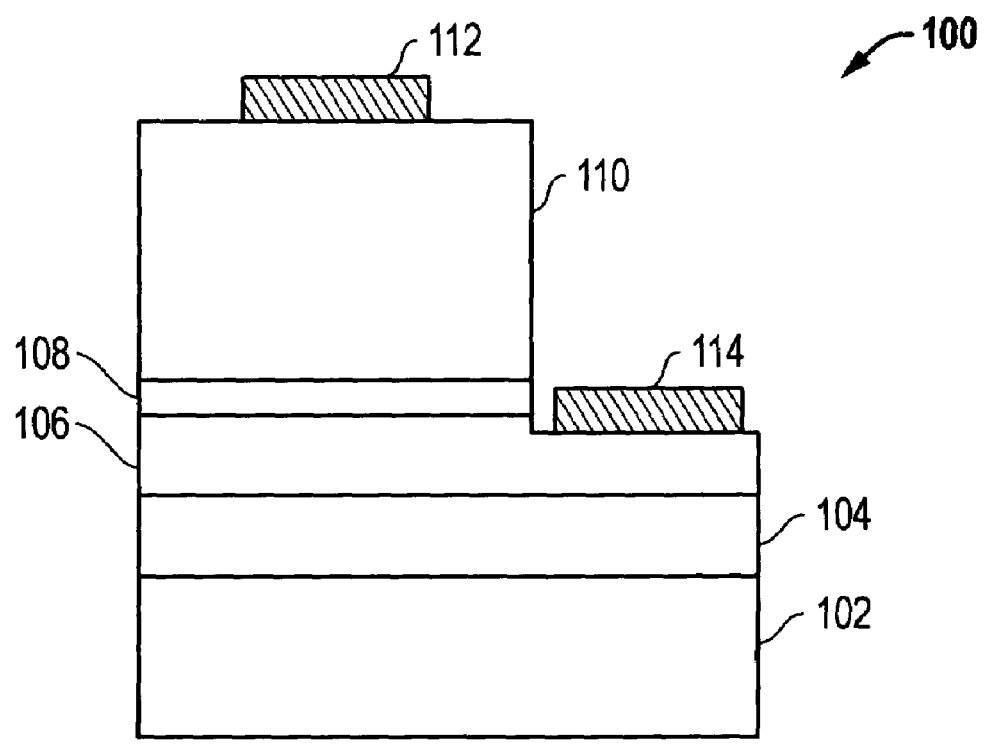
FIG. 10 illustrates an exemplary optoelectronic device according to an aspect of the present invention.

Turning to FIG. 10, an embodiment of an active optoelectronic device is illustrated. The particular optoelectronic device is an LED 100, containing multiple nitride semiconductor layers. LED 100 includes relatively thick n-type GaN HVPE-grown base layer 104 deposited on single crystal spinel device substrate 102 formed according to embodiments herein. The base layer is overlaid by an n-type GaN layer 106, an intermediate (InGa)N active layer 108, and an upper p-type GaN layer 110. The p-type GaN layer 110 has a p-type contact layer 112 formed thereon, and the lower n-type GaN layer 106 has an n-type contact layer 114 formed along a portion of the device. The n-type GaN layer 106 generally forms the active layer of the device. Additional processing and structural details of active optoelectronic devices such as LEDs are known in the art. The reader is directed to U.S. Pat. No. 6,533,874 for additional details related to such devices. While the foregoing embodiment illustrates an LED device, it is understood that the optical, electronic, or optoelectronic active devices may take on various other forms, such as a laser diode.

EXAMPLE

Crucible Charge Preparation: 392.1 g of MgO were combined with 2876.5 g of $Al_2O_3$ (aluminum oxide). The raw materials were mixed together and heated for 12 hrs. At 1100 degrees centigrade in ceramic crucible. After cooling, the mixture was transferred into an iridium crucible 100 mm in diameter and 150 mm tall.

Crystal Growth: The iridium crucible with the oxide mixture was placed in standard Czochralski crystal growth station, and heated to the melting point of the oxide mixture by means of radio frequency heating. An inert ambient atmosphere consisting of nitrogen with a small addition of oxygen was used around the crucible.

After the mixture was liquid a small seed crystal of the 1:1 spinel with <111> orientation attached to the pulling rod was used to initiate the start of the crystal growth process. A single crystal boule was grown utilizing the following process conditions, diameter 53 mm, length 150 mm, seed pulling rate 2 mm/hr, seed rotation rate 4 rpm, cool-down time 6 hrs, total time 123 hrs.

After cooling the crystal was visually inspected for bubbles, inclusions or any other visible defects. After visual inspection the top and bottom ends were removed, and crystal was subjected to an x-ray orientation check (Laue diffraction technique). After passing all inspection tests the crystal was used for "bar-stock" preparation.

The foregoing description has been presented for purposes of illustration and description. It is not intended to be exhaustive or to limit the scope to the precise form or embodiments disclosed, and modifications and variations are possible in light of the above teachings, or may be acquired from practice of embodiments of the invention.

What is claimed is:

1. A single crystal spinel boule formed by melt processing, the boule having a non-stoichiometric composition represented by the general formula $aAD.bE_2D_3$, wherein A is selected from the group consisting of Mg, Ca, Zn, Mn, Ba, Sr, Cd, Fe, and combinations thereof, E is selected from the group consisting Al, In, Cr, Sc, Lu, Fe, and combinations thereof, and D is selected from the group consisting O, S, Se, and combinations thereof, wherein a ratio b:a>2.5:1 such that the spinel is rich in $E_2D_3$.

2. The boule of claim 1, having a reduced mechanical stress or strain represented by a yield rate not less than about 20%, wherein yield rate is $w_i/(w_i+w_f) \times 100\%$, $w_i$=the number of intact wafers processed from said boule, and $W_f$=the number of fractured wafers from said boule due to internal mechanical stress or strain in the boule.

3. The boule of claim 2, wherein the yield rate is not less than about 30%.

4. The boule of claim 3, wherein the yield rate is not less than about 40%.

5. A single crystal spinel wafer formed by melt processing, the wafer having a non-stoichiometric composition represented by the general formula $aAD.bE_2D_3$, wherein A is selected from the group consisting Mg, Ca, Zn, Ba, Sr, Cd, Fe, and combinations thereof, E is selected from the group consisting Al, In, Cr, Sc, Lu, Fe, and combinations thereof, and D is selected from the group consisting O, S, Se, and combinations thereof, wherein a ratio b:a>2.5:1 such that the spinel is rich in $E_2D_3$.

6. The single crystal spinel wafer of claim 5, wherein the wafer has a diameter of not less than about 1.75 inches.

7. The single crystal spinel wafer of claim 5, wherein the wafer has a diameter of not less than about 2.0 inches.

8. The single crystal spinel wafer of claim 5, wherein the wafer has a diameter of not less than about 2.5 inches.

9. The single crystal spinel wafer of claim 5, wherein the boule consists essentially of a single spinel phase, with substantially no secondary phases.

10. The single crystal spinel wafer of claim 5, wherein A is Mg, D is O, and E is Al, such that the single crystal spinel has the formula $aMgO.bAl_2O_3$.

11. The single crystal spinel wafer of claim 5, wherein the ratio b:a is about 3:1.

12. The single crystal spinel wafer of claim 5, wherein the ratio b:a is about 2.9:1.

13. The single crystal spinel wafer of claim 5, wherein the wafer has a reduced internal stress or strain represented by a yield rate not less than about 20%, wherein yield rate is $w_i/(w_i+w_f)\times 100\%$, $w_i=$ the number of intact wafers processed from a boule, and $w_f=$ the number of fractured wafers from the boule due to mechanical stress or strain in the boule.

14. The single crystal spinel wafer of claim 5, wherein the ratio b:a is not greater than about 4:1.

15. The single crystal spinel wafer of claim 5, wherein the wafer has a lower mechanical stress and strain compared to stoichiometric spinel.

16. An optoelectronic substrate, consisting essentially of $aMgO.bAl_2O_3$ single crystal spinel, wherein a ratio b:a>2.5:1 such that the spinel is rich in $Al_2O_3$, and the single crystal spinel is formed by a melt process.

17. The substrate of claim 16, wherein the substrate comprises a wafer.

18. The substrate of claim 16, wherein the substrate comprises a die formed from a wafer.

19. The substrate of claim 18, wherein the die is cleaved from the wafer.

20. The substrate of claim 16, wherein the substrate has a surface suitable for epitaxial growth of an active layer thereon.

* * * * *

UNITED STATES PATENT AND TRADEMARK OFFICE
CERTIFICATE OF CORRECTION

PATENT NO. : 7,045,223 B2 Page 1 of 1
APPLICATION NO. : 10/669141
DATED : May 16, 2006
INVENTOR(S) : Milan Kokta et al.

It is certified that error appears in the above-identified patent and that said Letters Patent is hereby corrected as shown below:

Column 8, Claim 5, Line 44, please delete "spinet" and insert therefore --spinel--.

Column 8, Claim 5, Line 47, please delete "Zn, Ba," and insert therefore --Zn, Mn, Ba,--.

Signed and Sealed this

Fourteenth Day of November, 2006

JON W. DUDAS
*Director of the United States Patent and Trademark Office*